(12) United States Patent
Yurino

(10) Patent No.: US 8,940,583 B2
(45) Date of Patent: *Jan. 27, 2015

(54) MANUFACTURING METHOD OF A LEAD FRAME

(75) Inventor: Takahiro Yurino, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

This patent is subject to a terminal disclaimer.

(21) Appl. No.: 12/856,730

(22) Filed: Aug. 16, 2010

(65) Prior Publication Data

US 2010/0310781 A1    Dec. 9, 2010

Related U.S. Application Data

(62) Division of application No. 10/336,716, filed on Jan. 6, 2003, now abandoned.

(30) Foreign Application Priority Data

Jun. 7, 2002 (JP) .................................. 2002-166898

(51) Int. Cl.
*H01L 21/00* (2006.01)
*H01L 23/31* (2006.01)
(Continued)

(52) U.S. Cl.
CPC ...... *H01L 23/3142* (2013.01); *H01L 23/49586* (2013.01); *H01L 2224/48091* (2013.01);
(Continued)

(58) Field of Classification Search
CPC ........... H01L 2924/01019; H01L 2224/48091; H01L 2224/48247; H01L 2224/73265; H01L 2924/01029; H01L 2924/01078; H01L 24/48; H01L 2924/00014; H01L 2224/00

USPC ............... 427/443.1; 438/123, 124, 111, 121; 257/666, 672, 676, E33.066, E23.031, 257/E23.042, E23.043, E23.049, E23.05, 257/E23.052, E23.053, E23.054, E23.056, 257/E23.06, E23.066

See application file for complete search history.

(56) References Cited

U.S. PATENT DOCUMENTS 4,715,892 A * 12/1987 Mahulikar ..................... 75/233
4,888,449 A   12/1989 Crane et al.
(Continued)

FOREIGN PATENT DOCUMENTS

JP    61-139050 A    6/1986
JP    05-243470 A    9/1993
(Continued)

OTHER PUBLICATIONS

Copper Oxide Film Treatment, "Metal Surface Treatment Term Dictionary", Oct. 25, 1983, First Edition; p. 106.
(Continued)

*Primary Examiner* — Cuong Q Nguyen
*Assistant Examiner* — Yosef Gebreyesus
(74) *Attorney, Agent, or Firm* — Westerman, Hattori, Daniels & Adrian, LLP

(57) ABSTRACT

In a semiconductor device, a lead frame made of a copper alloy prevents exfoliation occurring near the surface of the lead frame. A copper oxide layer is formed on the base material made of a copper alloy by immersing the base material into a solution of a strong oxidizer. The copper oxide layer serves as an outermost layer and consists of a copper oxide other than a copper oxide in the form of needle crystals.

4 Claims, 7 Drawing Sheets

(51) Int. Cl.
*H01L 23/495* (2006.01)
*H01L 23/00* (2006.01)

(52) U.S. Cl.
CPC ............... *H01L2224/48247* (2013.01); *H01L 2224/48465* (2013.01); *H01L 2224/49171* (2013.01); *H01L 2224/73265* (2013.01); *H01L 2924/01029* (2013.01); *H01L 2924/01078* (2013.01); *H01L 24/48* (2013.01); *H01L 24/49* (2013.01); *H01L 2224/32245* (2013.01); *H01L 2924/01019* (2013.01)
USPC .......................................... 438/111; 438/123

(56) References Cited

U.S. PATENT DOCUMENTS

| | | | |
|---|---|---|---|
| 4,946,518 A | | 8/1990 | Spanjer et al. |
| 5,343,073 A | * | 8/1994 | Parthasarathi et al. ........ 257/666 |
| 5,402,006 A | * | 3/1995 | O'Donley ..................... 257/796 |
| 5,459,103 A | | 10/1995 | Kelleher et al. |
| 5,492,595 A | | 2/1996 | Carano et al. |
| 5,780,931 A | | 7/1998 | Shimoda et al. |
| 5,800,722 A | * | 9/1998 | Tsuyoshi et al. ................ 216/13 |
| 5,801,435 A | * | 9/1998 | Otsuki ........................... 257/675 |
| 5,937,279 A | | 8/1999 | Sawada et al. |
| 6,034,422 A | * | 3/2000 | Horita et al. .................. 257/677 |
| 6,087,715 A | * | 7/2000 | Sawada et al. ................. 257/666 |
| 6,120,639 A | | 9/2000 | Redline et al. |
| 6,630,734 B2 | * | 10/2003 | Okamoto et al. .............. 257/707 |
| 8,664,046 B2 | * | 3/2014 | Yurino ........................... 438/123 |

FOREIGN PATENT DOCUMENTS

| | | |
|---|---|---|
| JP | 9-199655 A | 7/1997 |
| JP | 10-303352 A | 11/1998 |
| JP | 11-97609 A | 4/1999 |
| JP | 11-243171 A | 9/1999 |
| JP | 2000-068303 A | 3/2000 |
| JP | 2002-060967 A | 2/2002 |

OTHER PUBLICATIONS

English Translation of Taiwanese Office Action dated Aug. 6, 2004, issued in correponding Taiwanese Patent Application No. 92100434.
Japanese Office Action dated Dec. 15, 2003, issued in corresponding Japanese Patent Application No. 2002-166898.
Korean Office Action dated Aug. 1, 2005, issued in corresponding Korean Patent Application No. 10-2003-0002939.

* cited by examiner

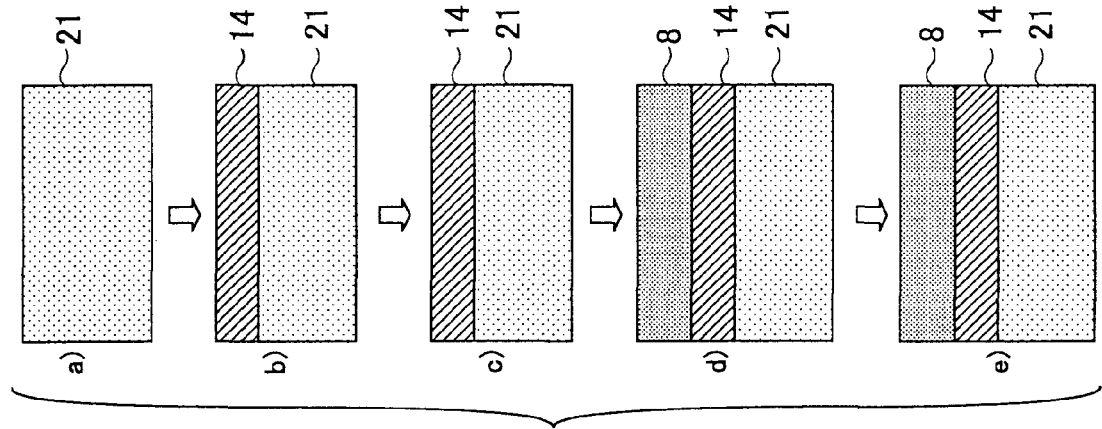
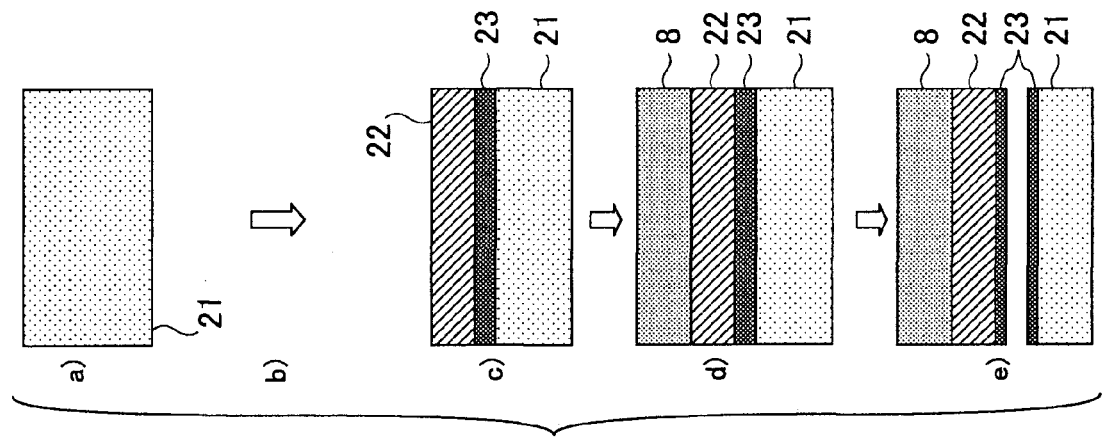

MANUFACTURING METHOD OF A LEAD FRAME

CROSS-REFERENCE TO RELATED APPLICATION

This application is a divisional application of U.S. Ser. No. 10/336,716, filed Jan. 6, 2003, which is based upon and claims the benefit of priority from the prior Japanese Patent Application No. 2002-166898, filed Jun. 7, 2002, the entire contents of which are hereby incorporated by reference.

BACKGROUND OF THE INVENTION

1. Field of the Invention

The present invention generally relates to semiconductor devices and, more particularly, to a semiconductor device which is formed by encapsulating a semiconductor element mounted on a lead frame by a seal resin.

2. Description of the Related Art

FIG. 1 is a cross-sectional view of a semiconductor device using a conventional lead frame. The semiconductor device 1 shown in FIG. 1 has a so-called lead type package, which is provided with many lead terminals extending from a resin seal part which encapsulates a semiconductor chip.

In FIG. 1, a semiconductor chip 2 is fixed on a die stage 4 of a lead frame 3 by a die-bonding material 5. Electrodes of the semiconductor chip 2 are connected to inner leads 7 by bonding wires 6, and the semiconductor chip 2, the die stage 4, the bonding wires 6 and the inner leads 7 are encapsulated by a seal resin 8. From the seal resin 8, outer leads 9 extend as terminals for external connection.

Generally, a lead frame is formed by processing and patterning a copper alloy plate by stamping, etching, etc. After patterning the copper alloy plate, silver (Ag) plating is applied at the end of each inner lead so as to facilitate wire bonding. If necessary, an organic discoloration preventing agent is applied to the whole lead frame. Zinc (Zn), lead (Pb), chromium (Cr), etc. are contained as additives in the copper (Cu) alloy forming the lead frame.

In a manufacturing process of the above-mentioned semiconductor device 1, the surface of the lead frame 3 is oxidized thermally in a heating process such as a wire-bonding process. That is, heating of the lead frame 3 forms a thin film of copper oxide on the surface. In such a case, a phenomenon occurs in which a very small amount of additive elements in the copper alloy is separated and condensed near a boundary between a copper oxide layer and a base material. Such a part into which the additive elements are condensed has a comparatively brittle characteristic. That is, thermal oxidation of the base material of the copper alloy forms a brittle layer between the copper oxide layer on the surface and the inner base material.

Additionally, the discoloration-preventing agent applied to the surface of the lead frame 3 also forms a brittle layer when a thermal oxidation film is formed in a heating process such as a wire-bonding process. That is, a part of elements contained in the discoloration preventing agent may form a brittle layer near the boundary between the copper base and the copper oxide film.

If a semiconductor device is heated in a solder reflow process in a case in which the semiconductor device, which is formed by encapsulating the lead frame 3 in which the above-mentioned brittle layer is formed, is mounted onto a mounting substrate, etc., a crack may occur in the brittle layer. If a moisture in the seal resin turns into steam and enters such a crack, as shown in FIG. 2, exfoliation may occur between the lead frame 3 (a copper alloy which is the material of the die stage 4) and the seal resin 8 (copper oxide layer of the surface of the die stage 4), and there may occur a problem of package cracking or internal cracking. Such a problem tends to appear more notably, if a mounting temperature rises due to use of a lead-free solder.

Additionally, an effect similar to the effect of the present invention may be obtained in a blackening treatment which forms needle crystals of cupric oxide (CuO) on a surface of a copper alloy process. However, depending on the state of formation of copper dioxide, exfoliation may occur between the copper oxide and the base material of the copper alloy when the completed semiconductor device is subjected to a solder reflow process, and there is no way to distinguish them by their appearance.

SUMMARY OF THE INVENTION

It is a general object of the present invention to provide an improved and useful semiconductor device in which the above-mentioned problems are eliminated.

A more specific object of the present invention is to provide a lead frame made of copper alloy which can prevent exfoliation occurring near the surface of the lead frame and a semiconductor device using such a lead frame.

In order to achieve the above-mentioned objects, there is provided according to one aspect of the present invention a lead frame comprising: a base material made of a copper alloy; and a copper oxide layer formed by contacting the lead frame with a solution of a strong oxidizer, the copper oxide layer serving as an outermost layer and consisting of a copper oxide other than a copper oxide in the form of needle crystals.

According to the above-mentioned invention, since the copper oxide layer is previously formed on the base material of the lead frame, the base material of the lead frame is not oxidized thermally and there is no brittle layer formed in the base material in a manufacturing process of a semiconductor device. Thus, even if the semiconductor device is heated after a resin encapsulation, the package of the semiconductor device is prevented from being swollen or cracked. Additionally, the copper oxide layer can be formed by merely immersing the lead frame into the solution of the strong oxidizer, which reduces an increase in the manufacturing cost of the semiconductor device.

Additionally, in the lead frame according to the present invention, a thickness of the copper oxide layer is preferably 10 to 1000 Angstroms. Since the copper oxide layer is very thin, the copper oxide layer does not change into a needle crystal layer. Thus, the copper oxide layer can be formed as a stable single layer on the surface of the base material.

Additionally, there is provided according to another aspect of the present invention a manufacturing method of a lead frame, comprising: configuring a base material made of a copper alloy into a predetermined pattern; applying plating to a part of the base material; and forming a copper oxide layer as an outermost layer on a surface of the base material by immersing the base material into a solution of a strong oxidizer, the copper oxide layer consisting of a copper oxide other than a copper oxide in the form of needle crystals.

In the manufacturing method according to the present invention, a time period for immersing the base material into the solution of the strong oxidizer may be adjusted so as to take the base material out of the solution of the strong oxidizer before the copper oxide changes to a needle crystal state.

Additionally, there is provided according to another aspect of the present invention a semiconductor device comprising: a lead frame having a copper oxide layer formed on a base material made of a copper alloy, the copper oxide layer formed by contacting the lead frame with a solution of a strong oxidizer and serving as an outermost layer, the copper oxide layer consisting of a copper oxide other than a copper oxide in the form of needle crystals; a semiconductor element mounted on a predetermined portion of the lead frame; and a seal resin encapsulating the semiconductor device.

In the semiconductor device according to the present invention, a thickness of the copper oxide layer may be 10 to 1000 Angstroms.

Other objects, features and advantages of the present invention will become more apparent from the following detailed description when read in conjunction with the accompanying drawings.

BRIEF DESCRIPTION OF THE DRAWINGS

FIGS. 7A and 7B are illustrations for explaining a processes of forming a copper oxide layer according to the present invention in comparison with a process of a conventional blackening treatment.

DETAILED DESCRIPTION OF THE PREFERRED EMBODIMENTS

A description will now be given, with reference to the drawings, of embodiments of the present invention.

Figure 3:
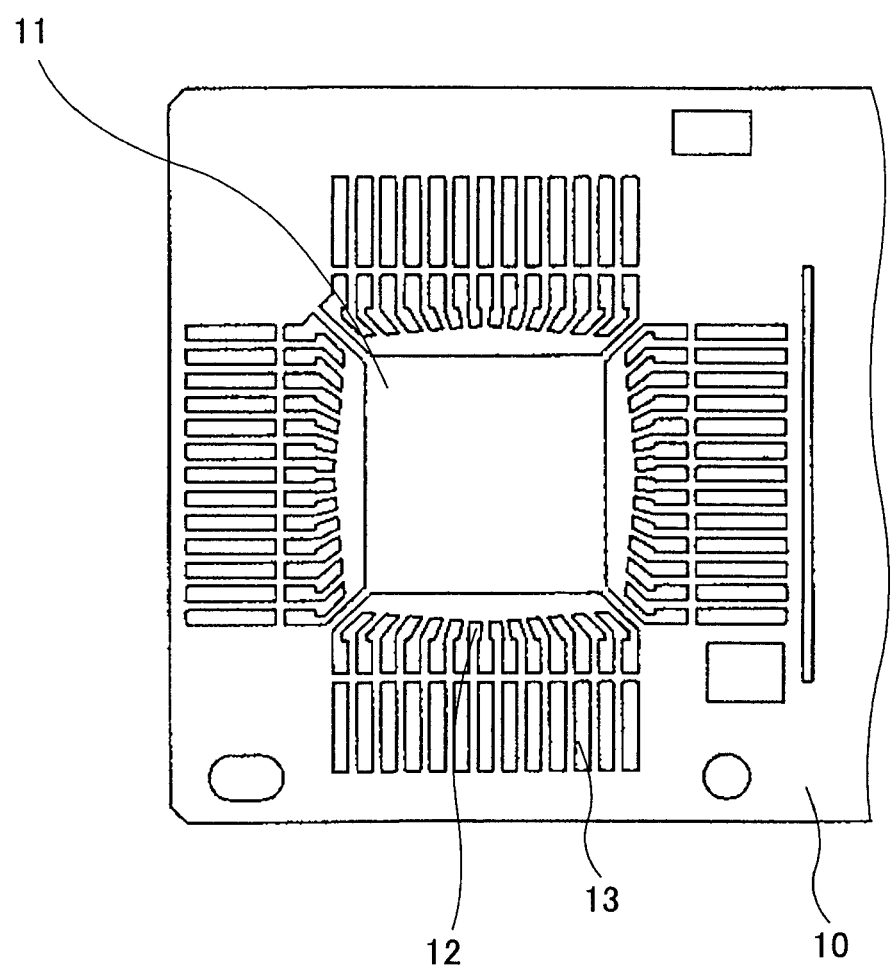
FIG. 3 is a plan view of a lead frame used in a semiconductor device according to an embodiment of the present invention.
Figure 4:
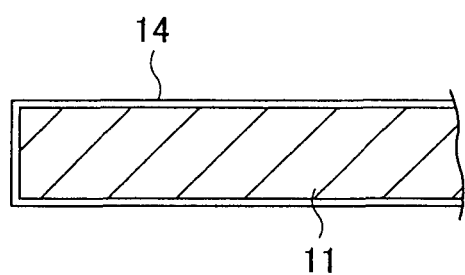
FIG. 4 is an enlarged cross-sectional view of a die stage of the lead frame shown in FIG. 3.

FIG. 3 is a plan view of a lead frame 10 used in a semiconductor device according to an embodiment of the present invention. FIG. 4 is an enlarged cross-sectional view of a die stage 11 of the lead frame 10 shown in FIG. 3. The lead frame 10 used in the semiconductor device according to the present invention is formed, similar to the conventional lead frame, by processing and patterning a copper alloy plate as a base. Generally, the copper alloy for lead frames contains a very small amount of zinc (Zn), lead (Pb), chromium (Cr), etc. as additive elements. The patterning of the copper alloy plate is performed by a known technique such as stamping and etching, as usual. After patterning the copper alloy plate so as to form the configuration of the lead frame 10, silver (Ag) plating is applied to the end of each of inner leads 12. Thus far, the same process is performed as the conventional lead frame.

Although an organic discoloration preventing agent may be applied after the silver plating in the conventional lead frame, the lead frame 10 according to the present invention omits the discoloration preventing agent on the surface, and a thin layer of copper oxide is formed on the surface of the lead frame 10. That is, the conventional lead frame is completed after applying a discoloration preventing agent onto the surface of the copper alloy plate, while in the lead frame 10 according to the present invention, the copper alloy, which is a base material, is oxidized by a special method mentioned later so as to form a copper oxide layer 14 as an outermost layer on the surface of the lead frame 10 (refer to FIG. 4).

As mentioned above, the lead frame 10 is completed after the copper oxide layer 14 is formed on the surface of the lead frame 10, especially the surface of a die stage 11. Then, the lead frame 10 is used for manufacture of a semiconductor device.

Figure 1:
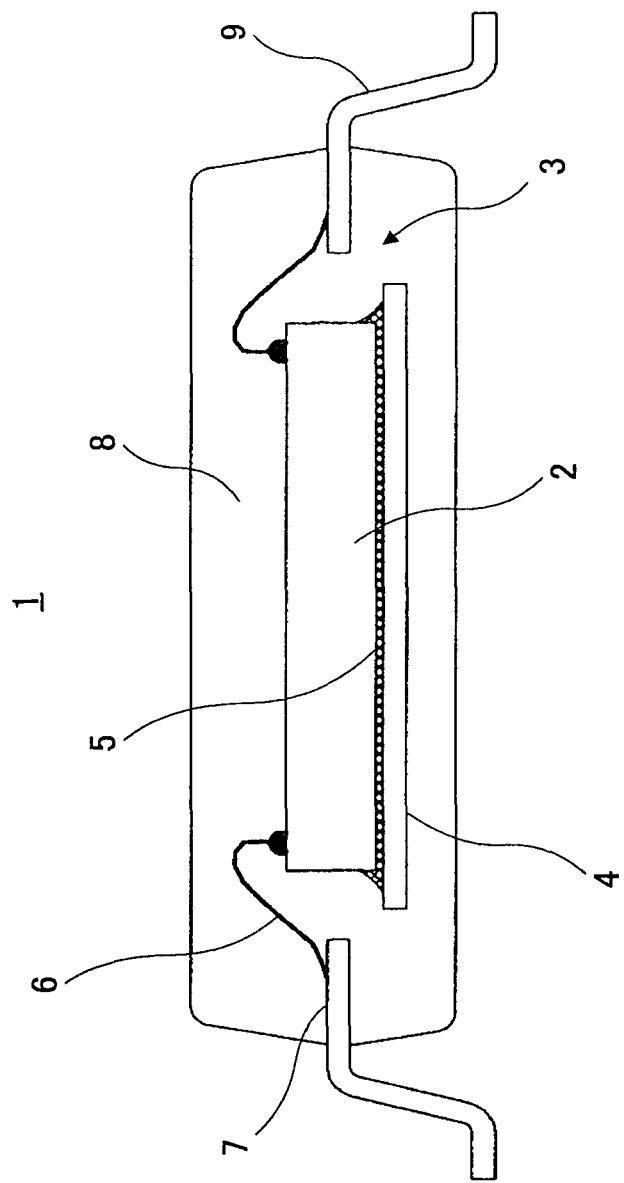
FIG. 1 is a cross-sectional view of a semiconductor device using a conventional lead frame.
Figure 2:
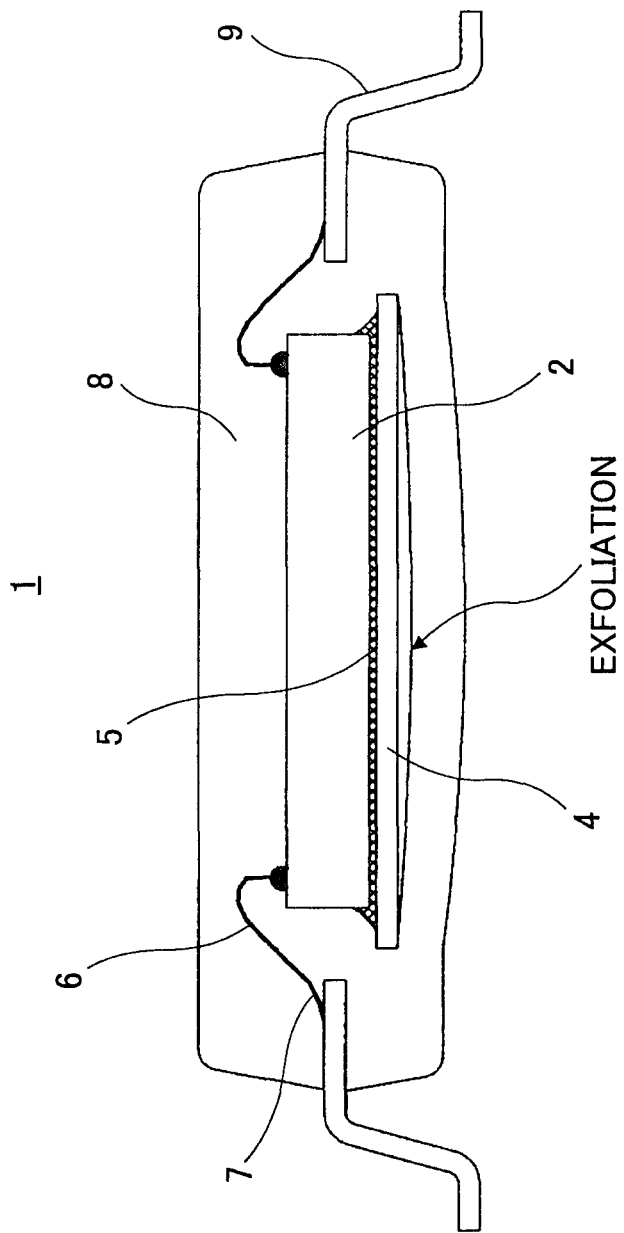
FIG. 2 is a cross-sectional view of the semiconductor device shown in FIG. 1, which shows exfoliation occurring between a die stage and a seal resin.
Figure 5:
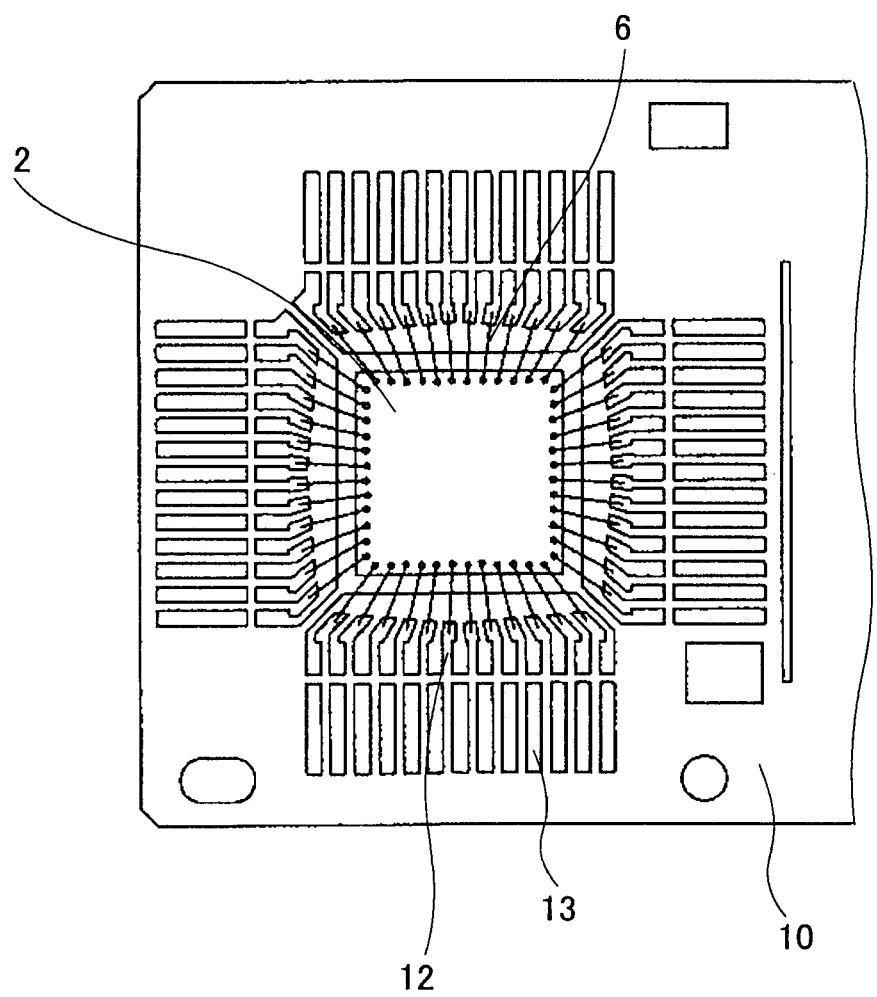
FIG. 5 is a plan view of the lead frame showing a state where wire-bonding is performed after mounting a semiconductor chip 2 on a die stage.
Figure 6:
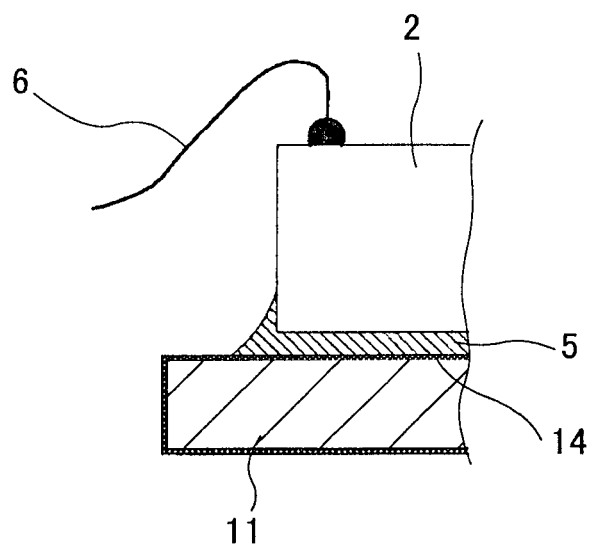
FIG. 6 is an enlarged side view showing the semiconductor chip mounted on the die stage.

Fundamental composition of the semiconductor device according to the embodiment of the present invention is the same as the semiconductor device shown in FIG. 1 except for the copper oxide layer 14 being formed in the lead frame 10. FIG. 5 is a plan view of the lead frame 10 showing a state where wire-bonding is performed after mounting the semiconductor chip 2 on the die stage 11. FIG. 6 is an enlarged side view showing the semiconductor chip 2 mounted on the die stage 11.

In the production process of the semiconductor device, the semiconductor chip 2 is first mounted onto the die stage 11 of the lead frame 10 with a die-bonding material 5 provided therebetween. Then, electrodes of the semiconductor chip 2 and the silver-plated parts of the inner leads 12 are connected by bonding wires 6. Thereafter, the die stage 11, the semiconductor chip 2, the bonding wires 6 and the inner leads 12 are encapsulated by a seal resin 8.

The semiconductor device according to the present embodiment uses the lead frame 10 in which the copper oxide layer 14 is formed on the surface of the base material. For this reason, even if the lead frame 10 is heated in a wire-bonding process, the copper in the base material of the lead frame 10 is not oxidized thermally. Therefore, there is no brittle layer, which may be formed between the copper alloy as the base material and the copper oxide layer due to condensation of the additive elements during the thermal oxidation process, thereby preventing package selling or cracking caused by the brittle layer.

A description will now be given, with reference to FIGS. 7A and 7B, of a formation process of the copper oxide layer 14 according to the present embodiment. FIGS. 7A and 7B are illustrations for explaining a process of forming the copper oxide layer 14 in comparison with a case where the copper oxide layer 14 is not formed. FIG. 7A shows the change of state near the surface of the lead frame in the case where the copper oxide layer is not formed, and FIG. 7B shows the change of state near the surface of the lead frame in the case where the copper oxide layer 14 according to the present embodiment is formed.

First, a base material 21, which constitutes a copper alloy plate, is patternized so as to from the plate into the configuration of the lead frame. In this state, as shown in FIG. 7A-(a) and FIG. 7B-(a), the copper alloy of the base material 21 is exposed on the surface of the lead frame.

Next, an oxidation treatment is applied to the lead frame 10 according to the present embodiment as shown in FIG. 7B-(b). This treatment is not applied in the case of FIG. 7A where the copper oxide layer is not formed. The oxidation treatment is performed by immersing the lead frame 10 into a solution of a strong oxidizer. Consequently, the copper in the base material 21 is oxidized by the strong oxidizer, and the copper oxide layer 14 is formed. Although the copper oxide layer 14 mainly consists of cuprous oxide($Cu_2O$), the copper oxide layer 14 also contains cupric oxide (CuO).

In the oxidization by the solution of a strong oxidizer, there is no separation of additive elements between the copper oxide layer 14 and the copper alloy of the base 21, and, thus, the brittle layer due to condensation of the additive elements is not formed. Additionally, even if the discoloration preventing agent is applied on the surface of the base material, a component of the discoloration preventing agent is not contained in the base material since the component is dissolved into the solution of the strong oxidizer, and, thus, a brittle layer is not formed.

Here, there is a so-called blackening treatment as a process for forming a copper oxide layer by immersing a copper alloy into a solution of a strong oxidizer. The blackening treatment is a process for forming a needle crystal layer of cupric oxide (CuO) on the surface of a copper alloy, and is called as a blackening treatment since the color of the needle crystal layer of cupric oxide (CuO) is black. Generally, the blackening treatment is a process to improve adhesion between a seal resin and a lead frame by configuring the surface of the lead frame into needle-like shape.

The solution of the strong oxidizer used for the blackening treatment is, for example, a mixed solution of sodium chlorite, sodium hydroxide and potassium peroxydisulfate. The needle crystal layer of cupric oxide (CuO) is formed by immersing the copper alloy into such a mixed solution for 3-10 minutes at a temperature of around 100° C.

Although the copper oxide layer 14 formed on the base material 21 in the present embodiment can also be formed using the mixed solution of the strong oxidizer for the above-mentioned blackening treatment, the copper oxide layer 14 is not a needle crystal layer. Namely, in the conventional blackening treatment, chemical reactions are continued until a copper oxide layer of the surface becomes a needle crystal layer of cupric oxide (CuO). On the other hand, the copper oxide layer 14 according to the present embodiment mainly consists of cuprouse oxide ($Cu_2O$), which is formed by taking the lead frame out of the mixed solution of a strong oxidizer prior to the formation of cupric oxide (CuO) which turns to the needle crystal layer.

Therefore, the time of oxidation treatment according to the present embodiment must be remarkably shorter than the time required by the conventional blackening treatment. Additionally, although the outermost layer of the lead frame, which has been subjected to the blackening treatment, is the needle crystal layer of cupric oxide (CuO), the lead frame 10 according to the present embodiment has the copper oxide layer 14 as the outermost layer which is not the needle crystal layer. Further, the thickness of the copper oxide layer 14 according to the present embodiment is remarkably smaller than the thickness of the needle crystal layer formed by the blackening treatment, and is sufficient in the order of about 10 to 1000 Å.

As mentioned above, since the copper oxide layer 14 according to the present embodiment can be formed by merely immersing the lead frame into a solution of a strong oxidizer for a very short tine, the copper oxide layer 14 can be easily formed without increasing the manufacturing cost of the lead frame. Moreover, the copper oxide layer 14 can be very thin, and can be formed as a stable cuprous oxide ($Cu_2O$) layer.

Next, when the semiconductor device is formed using the lead frame, the lead frame is heated in a wire-bonding process. At this time, as shown in FIG. 7A-(c), a copper oxide layer 22 is formed as shown in FIG. 7A-(c) due to thermal oxidation of copper of the exposed base material 21 in the case where the copper oxide layer 14 is not formed as shown in FIG. 7. On the other hand, in the case where the copper oxide layer 14 is formed in the above-mentioned oxidation treatment process, another copper oxide layer is not newly formed since the surface of the base material 21 is already covered by the copper oxide layer 14.

Here, in the case of FIG. 7A where the copper of the exposed base material 21 is oxidized thermally and the copper oxide layer 22 is formed, the additive elements in the base material 21 separate and condense between the copper oxide layer 22 and the base material 21, thereby forming a condensation layer 23. This condensation layer 23 corresponds to the above-mentioned brittle layer. On the other hand, in the case shown in FIG. 7A where the copper oxide layer 14 is formed, a copper oxide layer due to thermal oxidation is not formed, and, thus, the condensation layer 23 is not formed.

After the wire-bonding process, the semiconductor chip 2 is encapsulated by the seal resin 8. The semiconductor chip 2 is mounted and fixed onto the die stage 11 of the lead frame 10, and the die stage 11 is also encapsulated together with seal resin 8. Therefore, in the process of FIG. 7A, the copper oxide layer 22 is covered by the seal resin 8 as shown in FIG. 7A-(d). On the other hand, in the process of FIG. 7B, the copper oxide layer 14, which is forcibly formed by the oxidation process is covered by the seal resin 8 as shown in FIG. 7B-(d).

The formation of the semiconductor device is completed after the resin encapsulation is completed. At this time, the semiconductor device functions normally both in the case of FIG. 7A and the case of FIG. 7B. Accordingly, the semiconductor device is stored until it is used. During the time period of storage, the seal resin of the semiconductor device may absorb moisture from a surrounding atmosphere.

Then, when a product is manufactured using the semiconductor device, the semiconductor device is mounted onto a mounting substrate etc. In many cases, solder mounting is used for mounting the semiconductor device. Especially, a lead terminal type semiconductor device is mounted by soldering the outer leads to the electrode pads of the mounting substrate. In such a mounting process, the semiconductor device is subjected to the heat of the solder reflow. Since a lead-free solder has a high-melting point, the heating temperature reaches about 230-240° C.

When the semiconductor device is heated at such a temperature, a thermal stress generated in the semiconductor device (seal resin) is increased, which may cause a small crack formed in the brittle condensation layer 23. If the moisture, which the seal resin absorbed, enters such a crack and turns into steam exfoliation may occur in the condensation layer 23, as shown in FIG. 7A-(e), and a problem arises in that the seal resin is swollen or broken.

On the other hand, in the case of FIG. 7B where the semiconductor device is provided with the copper oxide layer 14 so as to prevent the formation of the condensation layer 23, there is no crack or breakage occurs near the boundary between the lead frame 10 and the seal resin 8 since there is no brittle layer, and, thus, there is no problem such as package swelling or cracking.

The inventors produced the base material 21 having the copper oxide layer 14 according to the present embodiment (in the case of FIG. 7B) and also produced the base material 21 having the copper oxide layer 22 which is formed by thermal oxidation (in the case of FIG. 7A), and performed tape pealing tests on both the copper oxide layers 14 and 22. The lead frames were placed on a heater block heated at 250° C. for 3 minutes, and then the copper oxide layers 14 and 22 are attached to tapes and pealed from the read frames. As a result, the copper oxide film 22, which is a thermal oxidation film, is exfoliated from the base material 21 in all of five test pieces. On the other hand, exfoliation did not occur in the copper oxide layer 14 according to the present embodiment in all of five test pieces. Therefore, it was proved that the copper oxide layer 14 according to the present embodiment is joined to the base material 21 of the lead frame more firmly than the copper oxide layer 22 formed by thermal oxidation.

As mentioned above, by using the lead frame 10 in which the copper oxide layer 14 according to the present embodiment is formed, package swelling or cracking due to heating of the semiconductor device in a mounting process can be prevented. Especially, even when a solder reflow is performed at 230-240° C. as in a mounting process using a lead-free solder, the semiconductor device can be prevented from being swollen or cracked.

The present invention is not limited to the specifically disclosed embodiments, and variations and modifications may be made without departing from the scope of the present invention.

The present application is based on Japanese priority application No. 2002-166898 filed Jun. 7, 2002, the entire contents of which are hereby incorporated by reference.

What is claimed is:

1. A manufacturing method of a lead frame, comprising:
configuring a base material made of a copper alloy into a first pattern;
applying plating to a part of the base material; and
forming a copper oxide layer as an outermost layer on a surface of the base material by immersing the base material into a solution of a strong oxidizer, the copper oxide layer including a copper oxide other than a copper oxide in the form of needle crystals and thickness of the copper oxide layer is from 10 Angstroms to 1000 Angstroms, and taking the base material out of the solution of the strong oxidizer before the copper oxide changes to a needle crystal state.

2. The manufacturing method as claimed in claim 1, wherein the solution of the strong oxidizer is a mixed solution of sodium chlorite, sodium hydroxide and potassium peroxydisulfate.

3. The manufacturing method as claimed in claim 2, wherein the immersing the base material into the solution of the strong oxidizer continues for 3 to 10 minutes.

4. The manufacturing method as claimed in claim 3, wherein the immersing the base material into the solution of the strong oxidizer is performed at a temperature of around 100° C.

* * * * *